(12) United States Patent
Minamio et al.

(10) Patent No.: US 7,884,437 B2
(45) Date of Patent: Feb. 8, 2011

(54) SEMICONDUCTOR DEVICE AND ELECTRONIC APPARATUS USING THE SAME

(75) Inventors: Masanori Minamio, Osaka (JP); Tetsushi Nishio, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/481,252

(22) Filed: Jun. 9, 2009

(65) Prior Publication Data

US 2010/0044816 A1    Feb. 25, 2010

(30) Foreign Application Priority Data

Aug. 25, 2008   (JP) .............................. 2008-215398

(51) Int. Cl.
*H01L 31/0232* (2006.01)
(52) U.S. Cl. .......................... 257/432; 257/59; 257/98; 257/291; 257/294; 257/431; 257/E33.068; 257/E33.073; 257/E33.076; 257/E31.106; 438/22; 438/24; 438/48
(58) Field of Classification Search .................. 257/59, 257/82, 98, 431, 432, 433, 434, 435, 436, 257/294, 208.1, 288, 289, 290, 291, 292, 257/293, 258, 461, E33.068, E33.073, E33.076, 257/E33.077, E31.106, E31.127, E21.527; 438/22, 24, 48, 70, 3, 309
See application file for complete search history.

(56) References Cited

U.S. PATENT DOCUMENTS 5,072,284 A    12/1991   Tamura et al.
6,037,248 A    3/2000    Ahn
6,097,097 A    8/2000    Hirose
6,414,343 B1 *  7/2002   Kondo et al. ................. 257/294
7,453,517 B2 * 11/2008   Fujimoto et al. ............. 348/374
7,479,627 B2 *  1/2009   Yoshimoto et al. .......... 250/239
7,563,635 B2 *  7/2009   Ikushima et al. .............. 438/55
7,776,225 B2 *  8/2010   Tsukamoto .................. 216/26
2005/0041134 A1 * 2/2005  Takayama .................... 348/340
2005/0169620 A1 * 8/2005  Minamio et al. .............. 396/71
2006/0208331 A1 * 9/2006  Wada .......................... 257/432
2007/0097341 A1 * 5/2007  Hikima ........................ 355/53
2007/0109439 A1   5/2007  Minamio et al.
2008/0067324 A1 * 3/2008  Heiler et al. .............. 250/208.1
2008/0073736 A1 * 3/2008  Hwang ........................ 257/432
2008/0083964 A1 * 4/2008  Fujimoto et al. ............. 257/432
2010/0044816 A1 * 2/2010  Minamio et al. ............. 257/432
2010/0084694 A1 * 4/2010  Kim ............................ 257/292
2010/0117176 A1 * 5/2010  Uekawa ...................... 257/432

FOREIGN PATENT DOCUMENTS

JP          2-229453         9/1990

* cited by examiner

*Primary Examiner*—Lynne A Gurley
*Assistant Examiner*—Yosef Gebreyesus
(74) *Attorney, Agent, or Firm*—McDermott Will & Emery LLP

(57) ABSTRACT

A semiconductor device includes: a semiconductor substrate having an imaging region in which a plurality of photoreceptors are arranged, and a peripheral circuit region arranged around the imaging region; a plurality of microlenses formed on the imaging region; a low-refractive-index film formed on the semiconductor substrate to cover the plurality of microlenses and part of the peripheral circuit region; and a transparent substrate formed on part of the low-refractive-index film above the imaging region. A through hole is formed in part of the low-refractive-index film above an amplifier circuit arranged in the peripheral circuit region.

7 Claims, 7 Drawing Sheets

US 7,884,437 B2

SEMICONDUCTOR DEVICE AND ELECTRONIC APPARATUS USING THE SAME

CROSS-REFERENCE TO RELATED APPLICATION

This application claims priority from Japanese Patent Application No. 2008-215398 filed on Aug. 25, 2008, the disclosure of which application is hereby incorporated by reference in its entirety for all purposes.

BACKGROUND OF THE INVENTION

The present disclosure relates generally to semiconductor devices and electronic apparatuses using the same, e.g., digital cameras and video cameras.

In electronic apparatuses such as digital cameras and video cameras, an imaging semiconductor device is installed behind a lens (i.e., the lens is arranged in front of the semiconductor device). The semiconductor device is generally configured as described below.

Specifically, the semiconductor device includes a semiconductor substrate provided with a peripheral circuit region formed on the periphery of one surface thereof, and an imaging region formed inside the peripheral circuit region, and a transparent substrate arranged on the imaging region of the semiconductor substrate. The imaging region of the semiconductor substrate includes a plurality of photoreceptors arranged in a two-dimensional matrix array, a plurality of microlenses arranged on the photoreceptors, and a low-refractive-index film formed on the plurality of microlenses. The low-refractive-index film is formed to cover at least part of the peripheral circuit region formed around the microlenses (see, e.g., Published Japanese Patent Application No. H2-229453).

SUMMARY OF THE INVENTION

In the semiconductor device configured as described above, an electrical signal level of image information is decreased particularly by parasitic capacitance in an amplifier circuit, and therefore finally obtained image information is decreased in quality. For example, the parasitic resistance may be increased by the low-refractive-index film covering at least part of the peripheral circuit formed around the microlenses. This reduces the electrical signal level of the image information, and reduces the quality of the finally obtained image information.

In view of the foregoing, the present invention aims to provide a semiconductor device including a structure that allows for improvement in image quality, and an electronic apparatus using the same.

Hereinafter, an example semiconductor device of the present invention will be described.

A semiconductor device including: a semiconductor substrate having, on its principle surface, an imaging region in which a plurality of photoreceptors are arranged, and a peripheral circuit region arranged around the imaging region; a plurality of microlenses formed on the imaging region; a low-refractive-index film formed on the semiconductor substrate to cover the plurality of microlenses and part of the peripheral circuit region; and a transparent substrate formed on part of the low-refractive-index film above the imaging region, wherein a through hole is formed in part of the low-refractive-index film above an amplifier circuit arranged in the peripheral circuit region.

In the semiconductor device, a plurality ones of the amplifier circuit are formed in the peripheral circuit region, and a plurality of through holes are formed so as to correspond to the plurality ones of the amplifier circuit.

In the semiconductor device, a transparent adhesive layer is provided between the low-refractive-index film and the transparent substrate, and an edge portion of the transparent adhesive layer covers the amplifier circuit and protrudes downward in the through hole to form a spherical surface.

The semiconductor device further includes: a cavity member having an opening in a top surface thereof in which the semiconductor substrate is placed; and a sealing resin formed to seal part of the semiconductor substrate outside the transparent substrate.

In the semiconductor device, the sealing resin covers the amplifier circuit, and part of the sealing resin in the through hole protrudes downward to form a spherical surface.

The semiconductor device further includes: an electrode formed on part of the peripheral circuit region outside the low-refractive-index film, and the electrode is electrically connected to a thin metal wire.

An electronic apparatus includes: the above-described semiconductor device; a mounting substrate on which an electrode for external connection of the semiconductor device is implemented on a mounting electrode; and a lens formed above the transparent substrate of the semiconductor device.

In the semiconductor device, the through hole is formed in part of the low-refractive-index film above the amplifier circuit arranged in the peripheral circuit region. Therefore, parasitic capacitance in the amplifier circuit can extremely be reduced. This allows for suppression of decrease in electronic signal level of image information, and improvement in finally obtained image information.

DETAILED DESCRIPTION OF THE INVENTION

The following detailed description and drawings are intended to clearly explain a technical idea of the present invention. Various modifications and additions may be made by those skilled in the art who comprehend the preferred embodiments of the invention without deviating from the spirit and scope of the disclosure of the present invention.

An embodiment of the present invention will be described below with reference to the drawings.

First, the structure of an example semiconductor device of the present invention will be described below.

Figure 1:
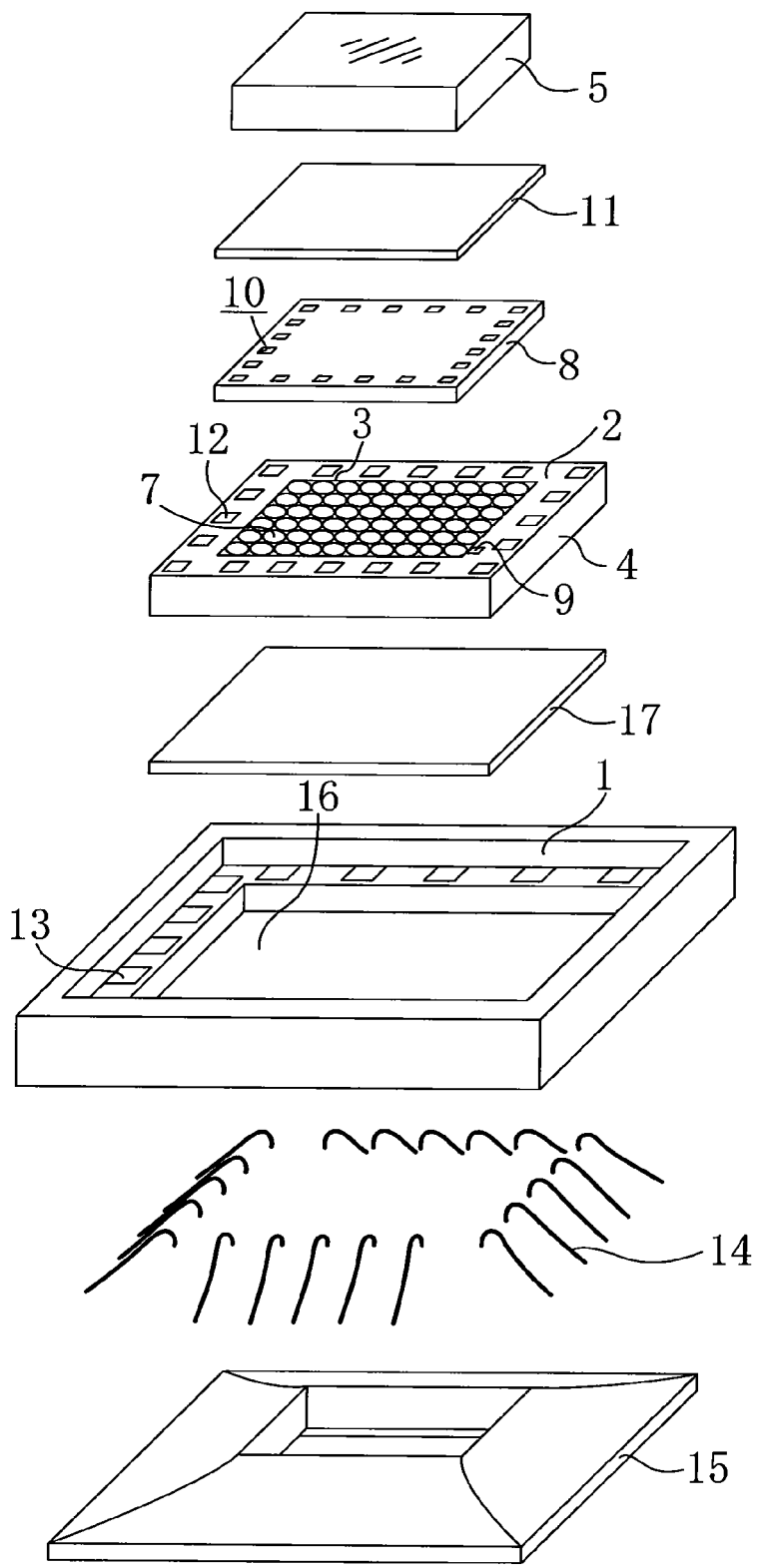
FIG. 1 is an exploded perspective view of an example semiconductor device of the present invention.
Figure 2A:
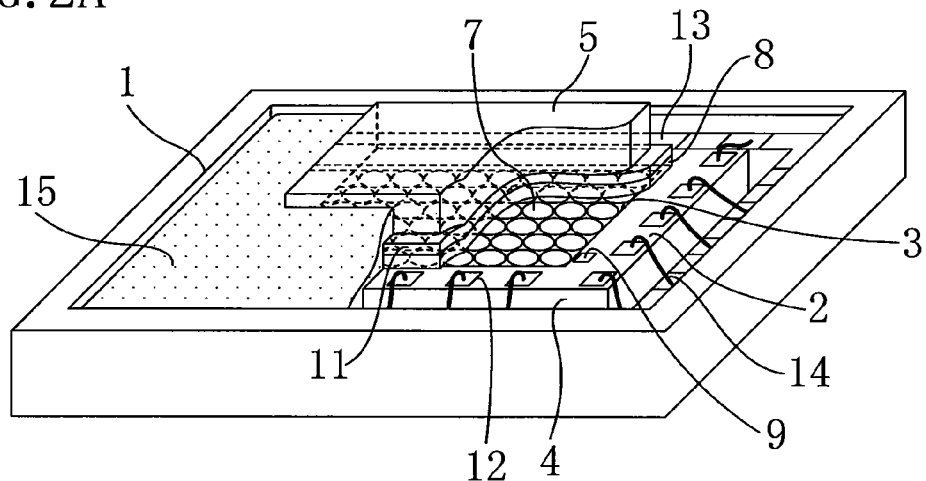
FIG. 2A is a perspective view of the example semiconductor device of the present invention.
Figure 2B:
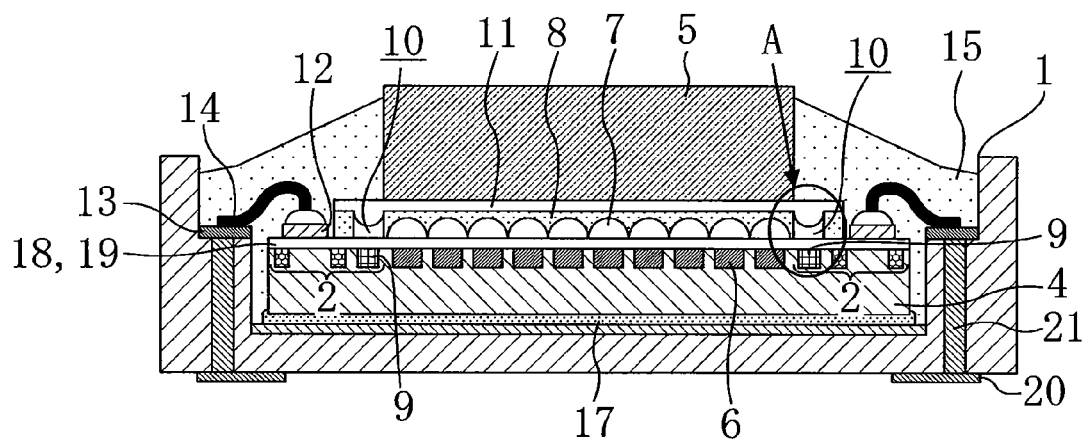
FIG. 2B is a cross-sectional view of the example semiconductor device of the present invention.
Figure 2C:
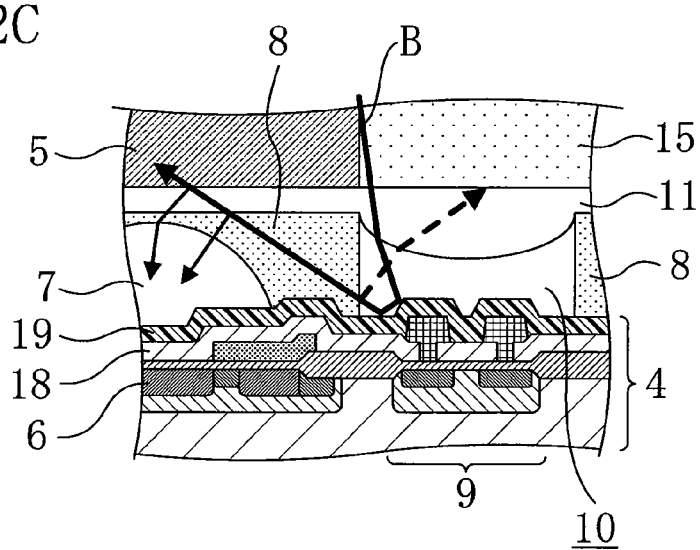
FIG. 2C is an enlarged cross-sectional view of region A shown in FIG. 2B illustrating an example of stray light.

FIG. 1 and FIGS. 2A to 2C illustrate the structure of the example semiconductor device of the present invention. FIG. 1 is an exploded perpendicular view of the example semiconductor device, FIG. 2A is a perspective view of the example semiconductor device, FIG. 2B is a cross-sectional view of the example semiconductor device, and FIG. 2C is an enlarged cross-sectional view of region A shown in FIG. 2B illustrating an example of stray light.

As shown in FIG. 1 and FIGS. 2A to 2C, the example semiconductor device includes a rectangular-box-shaped cavity member 1 having an opening in a top surface thereof, a rectangular semiconductor substrate 4 placed in the cavity member 1 and provided with a peripheral circuit region 2 arranged on the periphery of a top surface thereof, and an imaging region 3 arranged inside the peripheral circuit region 2; and a rectangular transparent substrate 5 arranged on the imaging region 3 of the semiconductor substrate 4.

The imaging region 3 of the semiconductor substrate 4 includes, as shown in FIGS. 2A and 2B, a plurality of photoreceptors 6 arranged in a two-dimensional matrix array, a plurality of microlenses 7 formed on the plurality of photoreceptors 6 with an interlayer insulating film 18 and a surface protection film 19 interposed therebetween, and a low-refractive-index film 8 arranged on the plurality of microlenses 7.

The low-refractive-index film 8 is formed by spin-coating an epoxy resin or an acrylic resin. Therefore, it covers substantially the whole top surface of the peripheral circuit region 2 formed around the microlenses 7. In the low-refractive-index film 8 covering the peripheral circuit region 2, a through hole 10 is formed above amplifier circuits 9 arranged in the peripheral circuit region 2 as shown in FIG. 1 and FIGS. 2B and 2C.

In the peripheral circuit region 2 formed around the microlenses 7, a plurality of amplifier circuits 9 are sparsely arranged in the shape of a rectangular frame. Therefore, as shown in FIG. 1, a plurality of through holes 10 are sparsely formed in the low-refractive-index film 8 in the shape of a rectangular frame to correspond to the amplifier circuits 9.

A transparent adhesive layer 11 is provided between the low-refractive-index film 8 on the imaging region 3 of the semiconductor substrate 4 and the transparent substrate 5 as shown in FIG. 1 and FIGS. 2A to 2C. The transparent adhesive layer 11 adhesively fixes the transparent substrate 5 onto the low-refractive-index film 8.

As shown in FIGS. 2A and 2C, an edge of the transparent adhesive layer 11 is positioned outside the amplifier circuits 9 formed in the peripheral circuit region 2 around the microlenses 7. Part of the transparent adhesive layer 11 corresponding to each of the through holes 10 formed in the low-refractive-index film 8 and above the amplifier circuits 9 protrudes downward from an upper opening of the corresponding through hole 10 to form a spherical surface as shown in FIG. 2C.

Electrodes 12 are formed in the peripheral circuit region 2 outside the through holes 10 in the low-refractive-index film 8 as shown in FIG. 1 and FIGS. 2A and 2B. The electrodes 12 and connecting terminals 13 in the cavity member 1 are electrically connected through thin metal wires 14.

Further, on part of the semiconductor substrate 4 outside the transparent substrate 5, a sealing resin 15 is formed to cover the peripheral circuit region 2, the through holes 10, the electrodes 12, and the thin metal wires 14 as shown in FIGS. 2A to 2C.

The semiconductor substrate 4 is fixed to an inner bottom surface of the cavity member 1 with a die pad 16 and a die bonding material 17 as shown in FIG. 1 and FIG. 2B.

As shown in FIG. 2C, an interlayer insulating film 18 and a surface protection film 19 are formed on the semiconductor substrate 4, and the surface protection film 19 is exposed in the through holes 10. Further, as shown in FIG. 2B, electrodes 20 for external connection are formed on an outer bottom surface of the cavity member 1 for connection with penetrating electrodes 21 penetrating the semiconductor substrate 4.

A method for fabricating the example semiconductor device of the present invention will now be described below.

FIGS. 3A to 3C and FIGS. 4A to 4C are cross-sectional views sequentially illustrating a method for fabricating the example semiconductor device of the present invention.

Figure 3A:
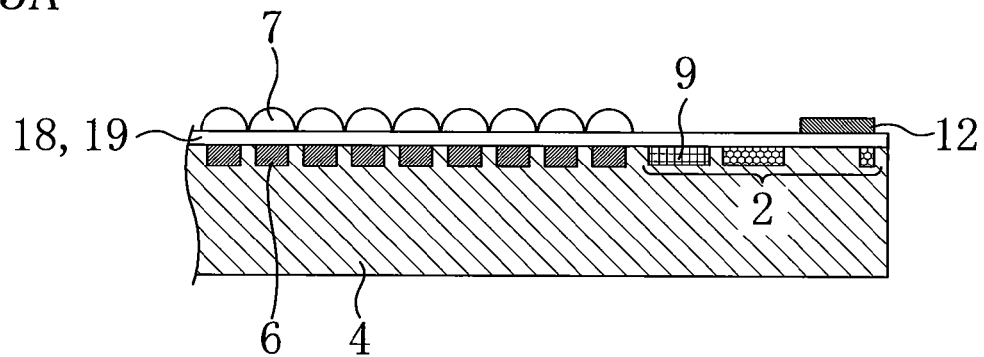
FIGS. 3A to 3C are cross-sectional views sequentially illustrating processes of a method for fabricating the example semiconductor device of the present invention.

First, as shown in FIG. 3A, on a semiconductor substrate 4 provided with photoreceptors 6 and a peripheral circuit region 2 including amplifier circuits 9, microlenses 7 and electrodes 12 are formed with an interlayer insulating film 18 and a surface protection film 19 interposed therebetween.

Figure 3B:
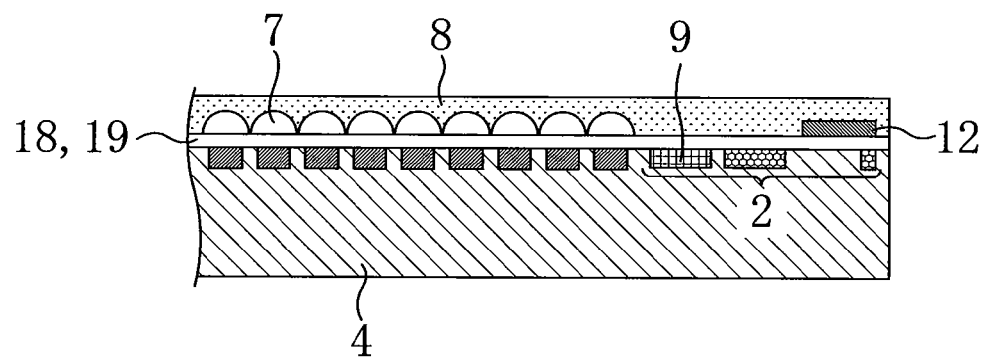

Then, as shown in FIG. 3B, a low-refractive-index film 8 is formed on the whole surface of the semiconductor substrate 4 to cover the microlenses 7 and the electrodes 12.

Figure 3C:
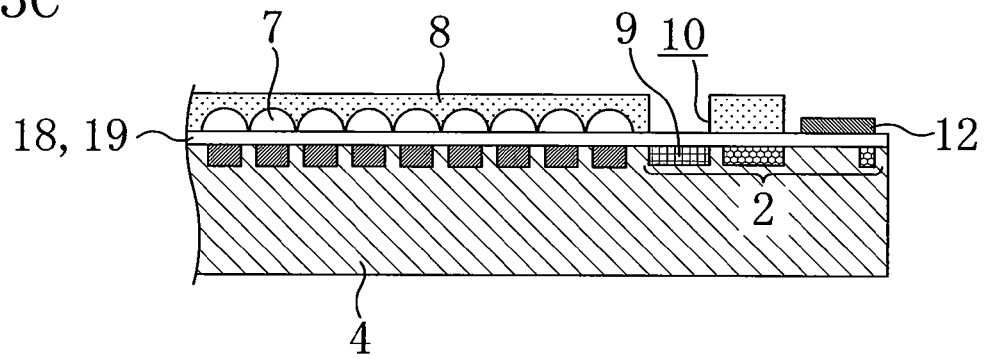

Then, as shown in FIG. 3C, predetermined parts of the low-refractive-index film 8 are removed by photolithography and etching. This process exposes the surfaces of the electrodes 12, and forms through holes 10 which expose parts of the peripheral circuit region 2 above the amplifier circuits 9.

Figure 4A:
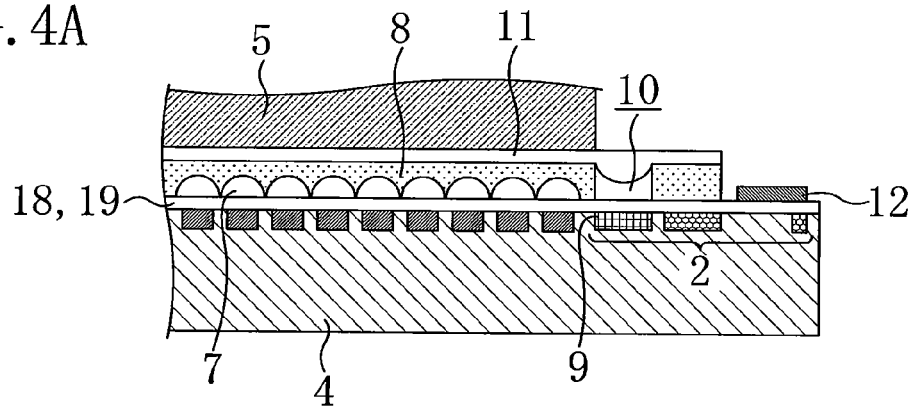
FIG. 4A to 4C are cross-sectional views sequentially illustrating processes of the method for fabricating the example semiconductor device of the present invention.

Then, as shown in FIG. 4A, a transparent adhesive layer 11 is formed on the low-refractive-index film 8, and a transparent substrate 5 is adhesively fixed onto the low-refractive-index film 8 by the transparent adhesive layer 11.

As shown in FIG. 4A, an edge of the transparent adhesive layer 11 is positioned outside the amplifier circuits 9 formed in the peripheral circuit region 2 around the microlenses 7. Part of the transparent adhesive layer 11 corresponding to each of the through holes 10 formed in the low-refractive-index film 8 and above the amplifier circuits 9 protrudes downward from an upper opening of the corresponding through hole 10 to form a spherical surface.

Figure 4B:
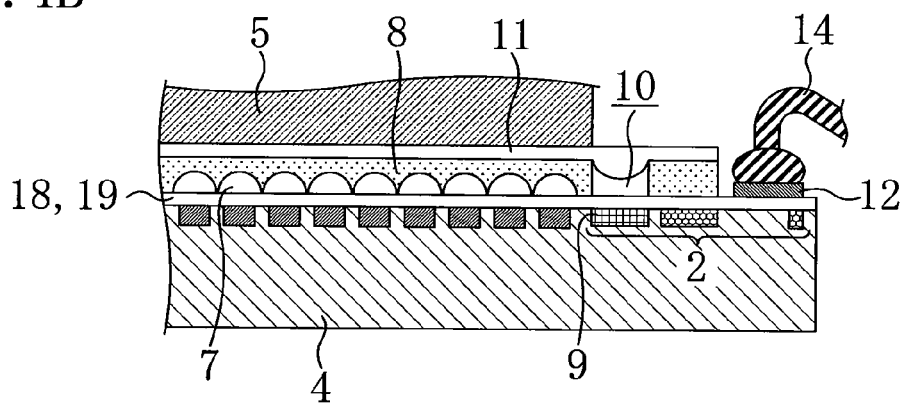

Then, as shown in FIG. 4B, thin metal wires 14 are formed to electrically connect the electrodes 12 and connecting terminals 13 in the cavity member 1 (see FIG. 1 and FIGS. 2A and 2B).

Figure 4C:
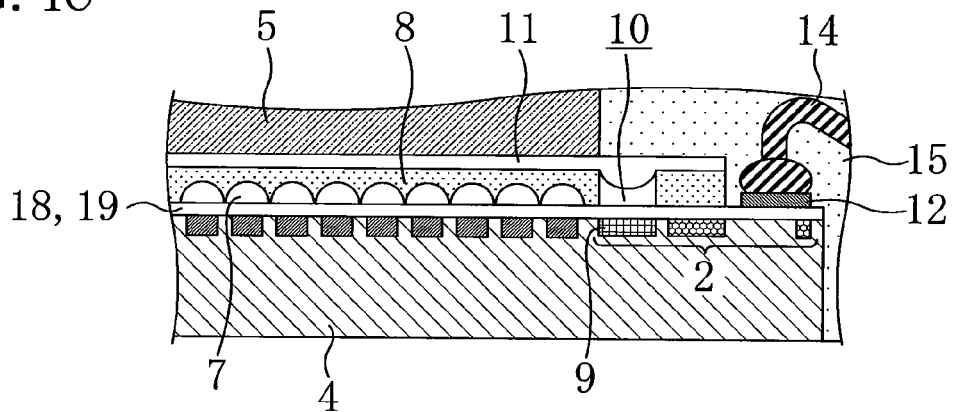

Then, as shown in FIG. 4C, a sealing resin 15 is formed on part of the semiconductor substrate 4 outside the transparent substrate 5 to cover the peripheral circuit region 2, the through holes 10, the electrodes 12, and the thin metal wires 14.

In this manner, the example semiconductor device of the present invention can be fabricated.

According to the example semiconductor device of the present invention and the method for fabricating the same, the through holes 10 are formed in the low-refractive-index film 8 covering the peripheral circuit region 2 and above the amplifier circuits 9 formed in the peripheral circuit region 2. This allows for significant reduction of parasitic capacitance in the amplifier circuits 9. In a conventional semiconductor device, the low-refractive-index film 8 covers the amplifier circuits 9. In contrast, in the example semiconductor device, the through holes 10 are provided above the amplifier circuits 9. Therefore, air functions as dielectric substance, and the parasitic capacitance can extremely be reduced. This allows for suppression of decrease in electrical signal level of image information, and improves the quality of finally obtained image information.

In this embodiment, a plurality of the through holes 10 are sparsely arranged in the shape of a rectangular frame in the peripheral circuit region 2. Therefore, an amount of stray light entering the photoreceptors 6 can be reduced, and the quality of image information can be improved. Specifically, the entrance of the stray light to the photoreceptors 6 is a phenomenon in which light other than light information entering through the imaging region 3 (from the front) enters the photoreceptors 6. For example, it is a phenomenon in which light reflected on the thin metal wire 14 outside the imaging region 3 enters the photoreceptors 6 obliquely from outside.

According to the present embodiment, when the stray light entering the photoreceptors 6 obliquely from the outside of the imaging region 3 is generated, the stray light comes into the through holes 10 formed outside the imaging region 3. Then, the stray light experiences significant change in travel path, and is drastically attenuated. This allows for drastic reduction in amount of the stray light reaching the photoreceptors 6, and improvement in quality of image information.

Further, light information entering the through hole 10 from above may be guided to the outside of the photoreceptors 6 by a lens effect of the transparent adhesive layer 11 which protrudes downward to form a spherical surface as described above. This also allows for drastic reduction in amount of the stray light reaching the photoreceptors 6, and improvement in quality of image information.

An example of the stray light is shown in FIG. 2C. Specifically, a thickness of an arrow B indicates the amount of the stray light. The stray light is reflected and attenuated every time it enters a different plane.

Figure 7:
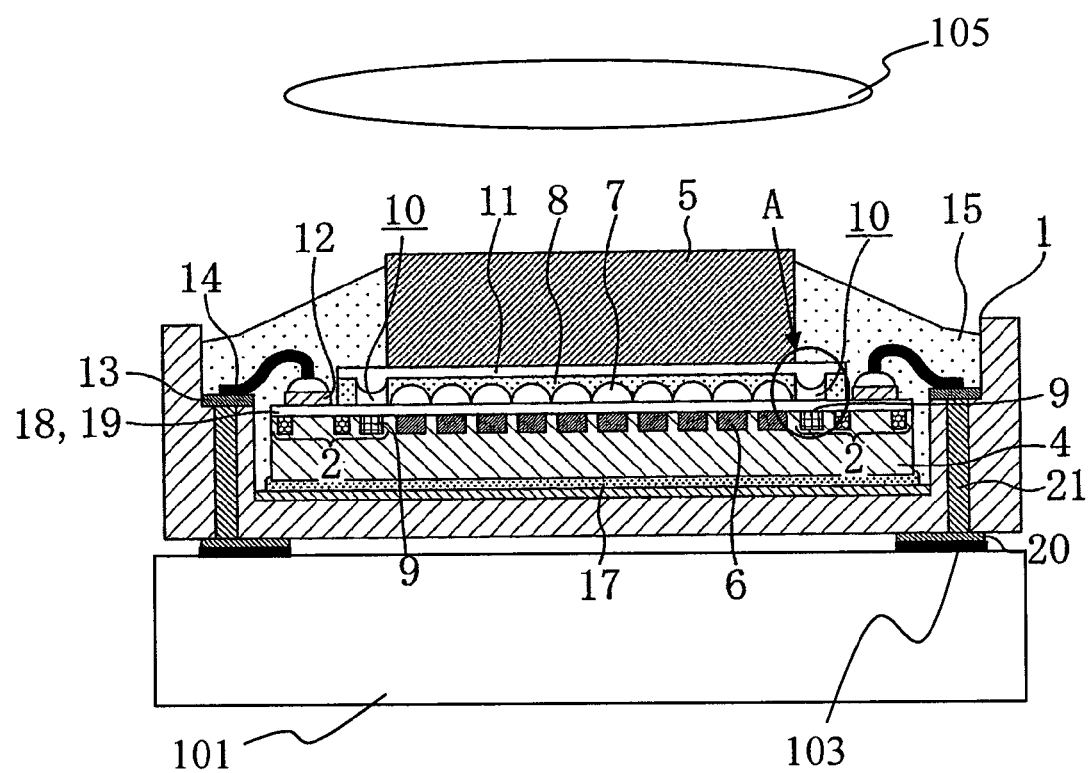
FIG. 7 is a cross-sectional view illustrating the structure of an electronic apparatus according to the present disclosure.

In this embodiment, the electrodes 20 for external connection, which are formed on the outer bottom surface of the cavity member 1 shown in FIG. 2B, are implemented on mounting electrodes 103 on a mounting substrate 101 as shown in FIG. 7. In this state, a lens 105 is arranged above the transparent substrate 5 to achieve an electronic apparatus such as a digital camera or a video camera.

—First Modification—

Figure 5:
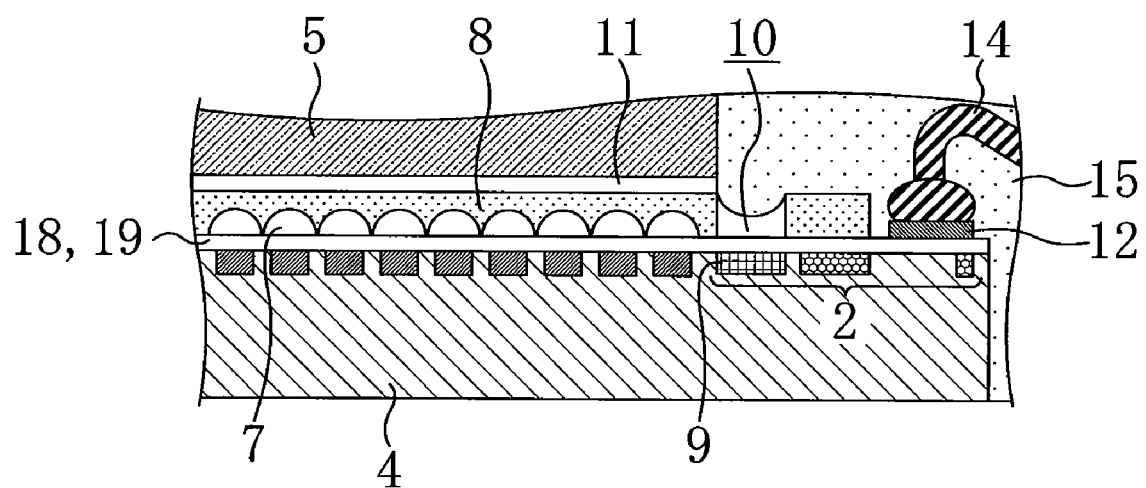
FIG. 5 is a cross-sectional view illustrating the structure of a first modification of the example semiconductor device of the present invention.

FIG. 5 shows the structure of a first modification of the example semiconductor device of the present invention.

In the semiconductor device shown in FIG. 5, the transparent adhesive layer 11 is formed only below the transparent substrate 5, i.e., it is not formed on a region outside the microlenses 7. Specifically, the through holes 10 and part of the low-refractive-index film 8 formed in the peripheral circuit region 2 outside the through holes 10 are covered with the sealing resin 15 without the transparent adhesive layer 11 interposed therebetween. Therefore, in the semiconductor device shown in FIG. 5, part of the sealing resin 15 protrudes downward from an upper opening (a top) of the through hole 10 to form a spherical surface. The first modification of the semiconductor device is different from the semiconductor device shown in FIGS. 2A to 2C in that the sealing resin 15 is formed above the through holes 10 instead of the transparent adhesive layer 11. However, the first modification of the semiconductor device is as advantageous as the semiconductor device shown in FIGS. 2A to 2C because it includes the through holes 10.

—Second Modification—

Figure 6A:
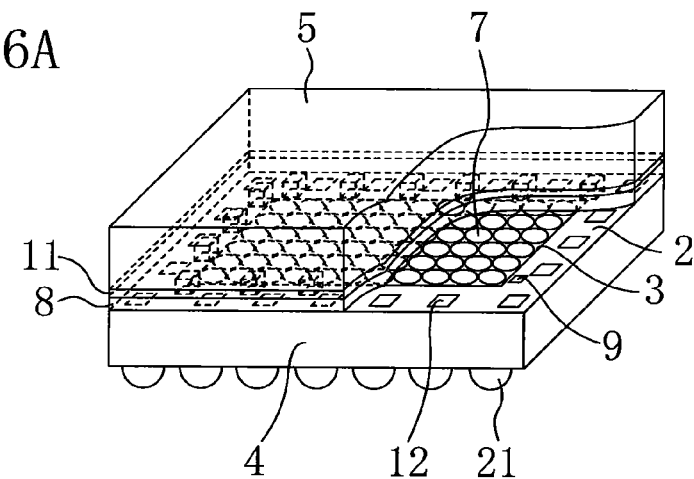
FIG. 6A is a perspective view of an example semiconductor device.
Figure 6B:
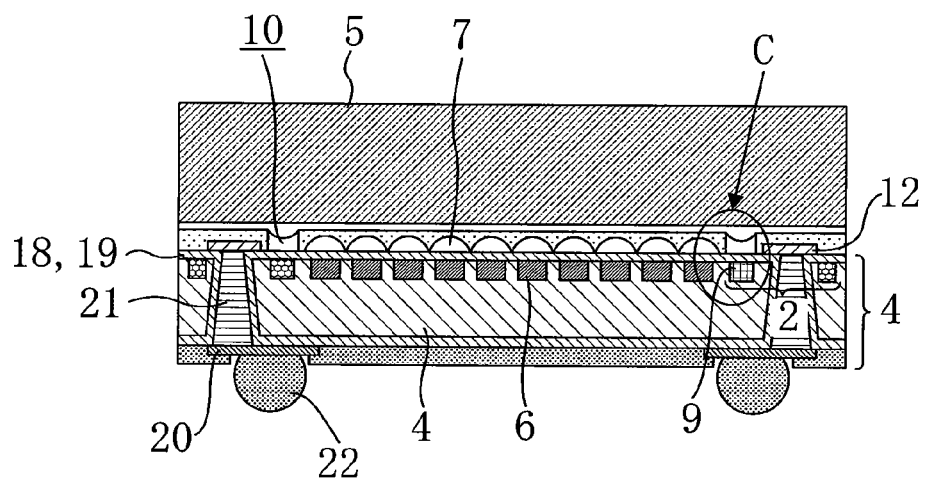
FIG. 6B is a cross-sectional view of the example semiconductor device.
Figure 6C:
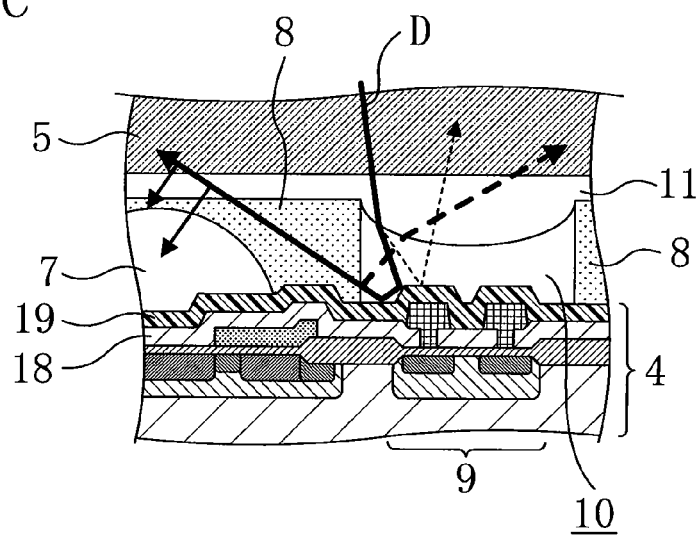
FIG. 6C is an enlarged cross-sectional view of region C shown in FIG. 6B illustrating an example of stray light.

FIGS. 6A to 6C show the structure of a second modification of the example semiconductor device of the present invention. FIG. 6A is a perspective view of the second modification of the semiconductor device, FIG. 6B is a cross-sectional view of the second modification of the semiconductor device, and FIG. 6C is an enlarged cross-sectional view of region C shown in FIG. 6B illustrating an example of stray light. FIG. 6C shows the stray light in the same manner as in FIG. 2C. Specifically, a thickness of an arrow D indicates an amount of the stray light. The stray light is reflected and attenuated every time it enters a different plane.

In the second modification of the semiconductor device shown in FIGS. 6A to 6C, the transparent substrate 5 is formed on the whole surface of the low-refractive-index film 8 with the transparent adhesive layer 11 interposed therebetween. Specifically, the sealing resin 15 is not formed on a region outside the microlenses 7, and instead, the transparent substrate 5 is formed to cover the whole surface. On the electrodes 20 for external connection formed on the outer bottom surface of the cavity member 1, ball-shaped electrodes 22 for external connection are arranged for connection with the penetrating electrodes 21. The semiconductor device is implemented on a mounting substrate of an electronic apparatus using the ball-shaped electrodes 22 for external connection. The second modification of the semiconductor device is as advantageous as the semiconductor device shown in FIGS. 2A to 2C because it includes the through holes 10.

Thus, the disclosure of the present invention is useful for electronic apparatuses such as digital cameras and video cameras because it can improve the quality of image information.

What is claimed is:

1. A semiconductor device comprising:
   a semiconductor substrate having, on a top surface of said semiconductor substrate, an imaging region in which a plurality of photoreceptors are arranged, and a peripheral circuit region arranged around the imaging region;
   a plurality of microlenses formed on the imaging region;
   a low-refractive-index film having a first surface and a second surface opposite to the first surface, the first surface being disposed on the semiconductor substrate to cover the plurality of microlenses and part of the peripheral circuit region; and
   a transparent substrate formed on part of the second surface the low-refractive-index film above the imaging region, wherein
   a through hole is formed in the low-refractive-index film above an amplifier circuit arranged in the peripheral circuit region, and is extended from the first surface to the second surface, and
   the amplifier circuit is covered by an insulating layer, said insulating layer being exposed through the through hole.

2. The semiconductor device of claim 1, wherein:
   a plurality of the amplifier circuits are formed in the peripheral circuit region, and
   a plurality of the through holes are formed so as to correspond to the plurality of the amplifier circuits.

3. The semiconductor device of claim 1, wherein
   a transparent adhesive layer is provided between the low-refractive-index film and the transparent substrate, and
   an edge portion of the transparent adhesive layer covers the amplifier circuit and protrudes downward in the through hole to form a spherical surface.

4. The semiconductor device of claim 1, further comprising:
   a cavity member having an opening in a top surface thereof in which the semiconductor substrate is placed; and
   a sealing resin formed to seal part of the semiconductor substrate outside the transparent substrate.

5. The semiconductor device of claim 1, wherein
   the sealing resin covers the amplifier circuit, and part of the sealing resin in the through hole protrudes downward to form a spherical surface.

6. The semiconductor device of claim 1, further comprising:
   an electrode formed on part of the peripheral circuit region outside the low-refractive-index film, and
   the electrode is electrically connected to a thin metal wire.

7. An electronic apparatus comprising:
   the semiconductor device of claim 1;
   a mounting substrate on which a mounting electrode is formed; and
   a lens formed above the transparent substrate of the semiconductor device,
   wherein an electrode for external connection of the semiconductor device is disposed on the mounting electrode.

* * * * *